(12) United States Patent
Lesso

(10) Patent No.: US 12,323,160 B2
(45) Date of Patent: Jun. 3, 2025

(54) FILTERS

(71) Applicant: Cirrus Logic International Semiconductor Ltd., Edinburgh (GB)

(72) Inventor: John P. Lesso, Edinburgh (GB)

(73) Assignee: Cirrus Logic Inc., Austin, TX (US)

( * ) Notice: Subject to any disclaimer, the term of this patent is extended or adjusted under 35 U.S.C. 154(b) by 570 days.

(21) Appl. No.: 17/538,286

(22) Filed: Nov. 30, 2021

(65) Prior Publication Data

US 2022/0376700 A1 Nov. 24, 2022

Related U.S. Application Data

(63) Continuation-in-part of application No. 17/324,511, filed on May 19, 2021.

(51) Int. Cl.
*H03M 1/12* (2006.01)
*H03M 1/66* (2006.01)
*H03M 1/82* (2006.01)

(52) U.S. Cl.
CPC ............ *H03M 1/82* (2013.01); *H03M 1/121* (2013.01); *H03M 1/662* (2013.01)

(58) Field of Classification Search
CPC ............ H03M 1/82; H03M 1/66; H03M 1/12; H03M 1/662; H03M 1/121
See application file for complete search history.

(56) References Cited

U.S. PATENT DOCUMENTS

| | | | |
|---|---|---|---|
| 4,047,108 A | 9/1977 | Bijker | |
| 4,159,448 A | 6/1979 | Parham | |
| 4,703,355 A * | 10/1987 | Cooper | H04N 7/0881 348/E5.014 |
| 7,403,144 B1 * | 7/2008 | Cruz-Albrecht | H03M 3/496 341/143 |
| 10,749,515 B1 | 8/2020 | Lin | |
| 11,295,758 B2 | 4/2022 | Gomez | |
| 2009/0207060 A1 * | 8/2009 | Hernandez | H03M 3/344 341/143 |
| 2010/0128247 A1 * | 5/2010 | Heizmann | G01S 7/484 356/5.01 |
| 2014/0105269 A1 * | 4/2014 | Mallinson | H03H 17/06 375/238 |
| 2014/0337036 A1 | 11/2014 | Haiut | |
| 2015/0088509 A1 | 3/2015 | Gimenez | |
| 2015/0215110 A1 * | 7/2015 | Chen | H04L 7/0041 327/158 |
| 2019/0287526 A1 | 9/2019 | Ren | |
| 2021/0233541 A1 | 7/2021 | Chen | |

OTHER PUBLICATIONS

Combined Search and Examination Report under Sections 17 and 18(3), UKIPO, Application No. GB2118299.3, mailed May 20, 2022.
Rudresh, Sunil et al., A Time-Based Sampling Framework for Finite-Rate-of-Innovation Signals, IEEE International Conf. on Acoustics, Speech and Signal Processing, May 4-8, 2020, INSPEC accession No. 19788779.

\* cited by examiner

*Primary Examiner* — Peguy Jean Pierre
(74) *Attorney, Agent, or Firm* — Jackson Walker L.L.P.

(57) ABSTRACT

An analog filter, comprising, a first-time encoding machine (TEM); and a first delay element.

22 Claims, 15 Drawing Sheets

FILTERS

This application is a continuation-in-part of U.S. patent application Ser. No. 17/324,511, filed May 19, 2021, which is incorporated by reference herein in its entirety.

TECHNICAL FIELD

The present disclosure relates to filters implemented using time encoding machines (TEMs).

BACKGROUND

Analog signal processing (ASP) is a type of signal processing conducted on continuous analog signals by analog means. Conventional analog filters have many advantages, not least their simplicity. However, construction of low noise, low frequency filters typically require a large circuit area due to the requirement for large capacitors which take up a large amount of circuit real estate.

SUMMARY

Embodiments of the present disclosure provide an alternative approach to designing analog filters using time encoding (TE). Embodiments described herein implement analog filters using strings of digital inverters for creating a delay. Such inverters occupy a small amount of circuit real estate. And unlike conventional analog filters which get larger with more advanced process nodes, TE implementations often actually reduce in size with more advanced process nodes. In addition, embodiments of the present disclosure substantially reduce or ameliorate filter variation due to process, voltage and temperature (PVT) fluctuations by using a delay-locked loop (DLL) for controlling filter delay, thereby improving their resilience to variable (e.g. external) conditions.

According to a first aspect of the disclosure, there is provided an analog filter, comprising: a first time-encoding machine (TEM); and a first delay element.

The first TEM may be configured to receive an input signal and generate a time encoded signal.

The first delay element may comprise one or more first inverters connected in series.

The first delay element may be configured to receive a supply voltage to control the delay of the one or more first inverters.

The analog filter may further comprising one or more delay-locked loops (DLL) configured to generate a supply voltage for the one or more first inverters of the first delay element. The one or more DLLs may comprise a plurality of DLLs each configured to generate a respective reference voltage. The analog filter may comprise control circuitry configured to cycle between each of the respective reference voltages to be provided as the supply voltage for the one or more first inverters of the first delay element.

The one or more DLLs may each comprise a delay line. The delay line may comprise one or more second inverters connected in series. Additionally or alternatively, the delay line may comprise the one or more first inverters of the first delay element.

Alternatively, the delay line may be switchable between comprising one or more second inverters connected in series and comprising the one or more first inverters of the first delay element. The analog filter may further comprise control circuitry configured to periodically switch the delay line between comprising the one or more second inverters and comprising the one or more first inverters of the first delay element.

The first delay element may be switchable between comprising one or more second inverters connected in series and comprising the one or more first inverters of the first delay element.

The delay line may be an analog delay line or a digital delay line. Where the delay line is a digital delay line, the delay line may comprise a plurality of second inverters, the DLL comprising DLL control circuitry configured to control the number of the second inverters provided in the delay line.

The delay element may be an analog delay element or a digital delay element.

The analog filter may comprise a feedback filter having a first feedback loop, wherein the delay element is provided in the first feedback loop. The analog filter may be a feedback comb filter. The analog filter may further comprise a first resistance provided in the first feedback loop.

The analog filter may comprise a feedforward filter having a feedforward loop. The delay element may be provided in the feedforward loop. The feedforward filter may be a finite impulse response (FIR) filter.

The analog filter may comprise a biquadratic filter having a first feedback look comprising the first delay element, a second feedback loop comprising the first delay element and a second delay element, a first feedforward loop comprising the first delay element, a second feedforward loop comprising the second delay element and a third delay element.

It will be appreciated that the filter may be a multistage filter having one or more feedback loops and feedforward loops.

According to another aspect of the disclosure, there is provided an electronic device comprising the analog filter as described above.

The electronic device may comprise one of a mobile computing device, a laptop computer, a tablet computer, a games console, a remote-control device, a home automation controller or a domestic appliance, a toy, a robot, an audio player, a video player, or a mobile telephone, and a smartphone.

Throughout this specification the word "comprise", or variations such as "comprises" or "comprising", will be understood to imply the inclusion of a stated element, integer or step, or group of elements, integers or steps, but not the exclusion of any other element, integer or step, or group of elements, integers or steps.

BRIEF DESCRIPTION OF DRAWINGS

Embodiments of the present disclosure will now be described by way of non-limiting examples with reference to the drawings, in which.

DESCRIPTION OF EMBODIMENTS

Embodiments of the present disclosure provide an alternative approach to designing analog filters using time encoding (TE). Embodiments described herein implement analog filters using strings of digital inverters for creating delay. Such inverters occupy a small amount of circuit real estate. And unlike conventional analog filters which get larger with more advanced process nodes, TE implementations often actually reduce in size with more advanced process nodes. In addition, embodiments of the present disclosure substantially reduce or ameliorate filter variation due to process, voltage and temperature (PVT) fluctuations by using a delay-locked loop (DLL) for controlling filter delay, thereby improving their resilience to variable conditions.

Time encoding (TE) is a technique in which an analog signal is converted into a signal that is amplitude quantised (e.g. between a first level (zero) and a second level (one)) but is not time quantised (i.e. the edges of the signal can occur wherever needed). In other words, in a time encoded signal, data is encoded in the timing of transitions between the first and second levels of the amplitude quantised signal. Whilst a TE signal has a finite number of amplitude states (e.g. 2 states (high and low) or 3 states (−1, 0 and 1)), the TE signal is still an analog waveform.

A variety of time encoding techniques are known in the art. An example of time encoding is pulse width modulation (PWM). Various techniques exist which can be used to generate a PWM signal, such as asynchronous PWM, self-oscillating carrier PWM and fixed carrier PWM.

Figure 1:
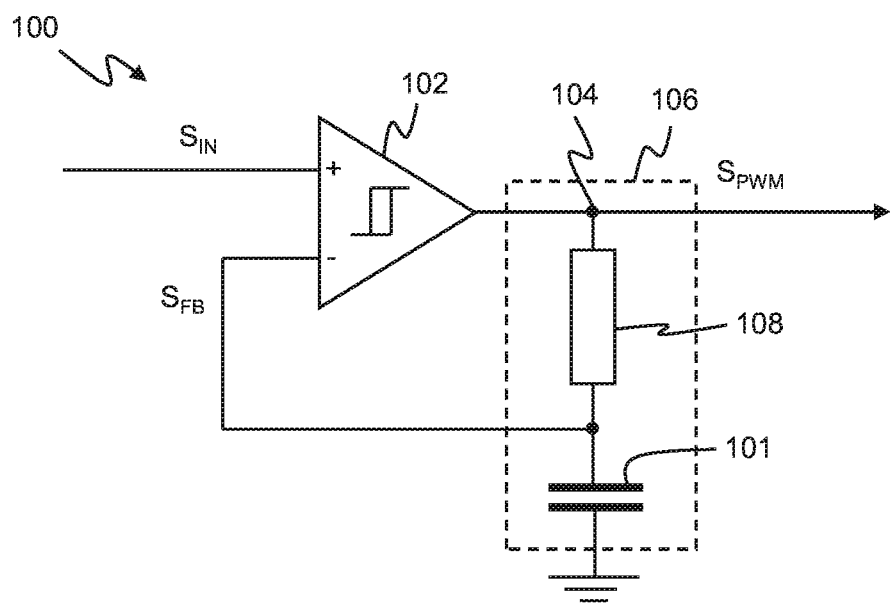
FIG. 1 is a schematic diagram of a time encoding module (TEM)

FIG. 1 is a schematic diagram of an example time encoding modulator (TEM) 100 implementing self-oscillating carrier PWM. Generally, the TEM 100 is configured to receive an input signal SIN, which may for instance be an input analog audio signal, and generating a corresponding time-encoded signal. In at least some embodiments of the disclosure the time-encoded signal is a pulse-width modulated (PWM) signal SPWM that alternates between different signal levels to encode the signal level of the input signal SIN by the proportion of time spent in each output state. Typically the PWM signal SPWM may swap between first and second output states and the signal level of the input signal may be encoded by the duty cycle of a first output state, i.e. the proportion of the overall cycle period that corresponds to the first output state, or equivalently the amount of time that the PWM signal SPWM spends in the first output state compared to the second output state.

In the embodiment shown in FIG. 1, the time-encoding modulator (TEM) 100 advantageously comprises a hysteretic comparator 102. In this embodiment the hysteretic comparator 102 is arranged to receive the input signal SIN at a first comparator input, in this example the non-inverting input (+). The hysteretic comparator 102 compares the input signal SIN at the first comparator input with a feedback signal SFB received at a second comparator input, in this example the inverting input (−), and applies hysteresis to the comparison to generate the PWM signal SPWM at a comparator output node 104. A feedback path also extends from the comparator output node 100 to the second comparator input, in this example the inverting input (−), for providing the feedback signal SFB to the second comparator input. A loop filter 106 is arranged to apply filtering to the feedback path to provide the feedback signal SFB. In this embodiment the loop filter 106 comprises an impedance in the form of a resistive-capacitive (RC) filter having a resistive element 108 in the feedback path and a reactance, in this case a capacitance 101, coupled between the feedback path and a reference voltage, e.g. ground. Whilst the filter arrangement 106 may be implemented using resistors and capacitors as illustrated, other RC equivalent components such as FET based resistances and/or capacitances may be used in some implementations.

Figure 2:
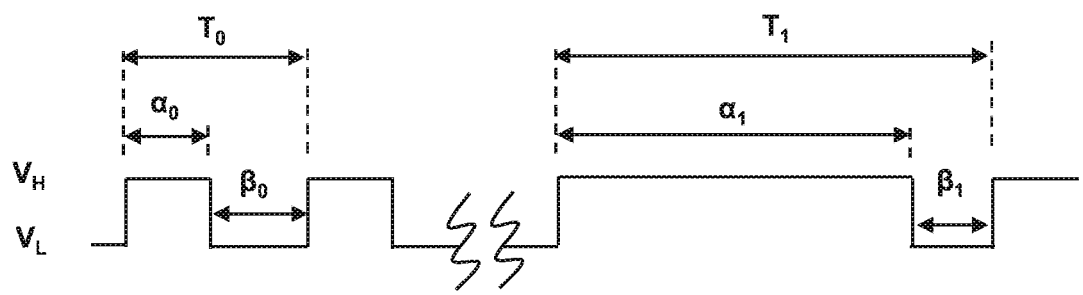
FIG. 2 is a timing diagram for the TEM of FIG. 1.

Referring also to FIG. 2, the hysteretic comparator 102 compares the signals at the first and second comparator inputs, i.e. the input signal SIN and the feedback signal SFB, and outputs either of two output states, VH and VL, depending on the result of the comparison. The hysteretic comparator 102 is operable to apply hysteresis to the comparison such that a differential voltage between the signals SIN and SFB at the first and second comparator inputs must be greater (i.e. more positive or less negative) than a first threshold to transition from one output state to the other, say from output state VL to the output state VH, but must be lower (i.e. less positive or more negative) than a second, different threshold to make the opposite transition, e.g. to swap from the output state VH to the output state VL. The difference between these first and second thresholds corresponds to the amount of hysteresis applied. In some implementations the first and second thresholds may be equal in magnitude and opposite in polarity, i.e. the difference between the input signal SIN and the feedback signal SFB must be greater than an amount +H to transition to one state, say VH, and must be lower than −H to transition to the other state, say VL. In this instance the magnitude of H can be seen as a measure of the hysteresis applied by the hysteretic comparator 1002 and the hysteresis applied is symmetric. It will be understood however that the hysteresis applied could be asymmetric in some implementations.

In some embodiments the output states VH and VL may be high and low voltage levels respectively, for instance a supply voltage VDD (VH) and ground (VL), or a positive voltage V+ (VH) and a negative voltage V− (VL), possibly of equal magnitude. Thus the PWM signal SPWM transitions between two output voltage states.

The input signal SIN is thus compared to the feedback signal SFB which is derived from the output PWM signal SPWM. The feedback signal SFB corresponds to a filtered version of the PWM signal SPWM and the filter arrangement 106 provides some delay and signal averaging over time. Thus if the PWM signal SPWM transitions to the high state VH, the feedback signal SFB will, initially, be lower than the present state of the PWM signal SPWM and will begin to increase over a period of time. If the input signal SIN is itself relatively constant over that period of time the difference between the input signal SIN and the feedback signal SFB will decrease until the relevant threshold is reached and the PWM signal SPWM transitions to the other output state VL. At this point the value of the feedback signal SFB will start to decrease. The hysteretic comparator 201 will maintain the low state VL until the difference between the input signal SIN and the feedback signal SFB increases, i.e., becomes less negative/more positive, to the second threshold.

Note that the arrangement illustrated in FIG. 1 assumes that the input signal SIN will vary within a range within the voltage range of the output state VH and VL and is referenced to a midpoint voltage VMID which is equal to the midpoint voltage between VH and VL. If necessary, level shifting and/or scaling could be applied to at least one of the input signal SIN or feedback signal SFB to prevent the TEM 100 from operating out of range.

Thus if the input signal SIN maintains a relatively constant level the output of the hysteretic comparator 102 will continually cycle between the first and second output states VH and VL. The time spent in each output state will depend on how long it takes for the feedback signal SFB to change by the amount defined by the hysteresis, e.g. from a value equal to SIN−H to a value SIN+H or vice versa. This will depend on the amount of hysteresis and the rate of change of the feedback signal SFB. However the rate of change of the feedback signal SFB will depend on the then-current value of the feedback signal SFB, in particular the difference between the level of the output state, i.e. VH or VL, and the value of the feedback signal SFB, which in turn depends on the level of the input signal SIN.

The duration of a pulse corresponding to the high state VH in the PWM signal SPWM (and correspondingly the duration of a pulse corresponding to the low state VL in the PWM signal SPWM) thus depends on the level of the input signal SIN. The TEM 100 encodes the input signal SIN as the duty cycle of the PWM signal SPWM, i.e. the ratio between the duration of a pulse of a first output state, say VH, to the duration of the cycle period.

FIG. 2 illustrates the principles of the PWM signal SPWM of the TEM 100 shown in FIG. 1. The PWM signal SPWM varies between the two output states VH and VL. The duration of a pulse of the high state VH is denoted by a and the duration of a pulse of the low state VL is denoted by 3. The cycle period T is equal to $\alpha+\beta$. For cycles which do not correspond to duty cycles of 100% or 0% the cycle period T can also be seen as the period between an instance of a transition from one output state to the other output state and the next instance of the same transition.

As described above the duration a of the pulse of the high state VH depends on the level of the input signal SIN, as does the duration of the pulse of the low state VL. For signals of zero magnitude (which corresponds to a signal reference voltage value equal to the midlevel voltage VMID between VH and VL) the periods of the pulses of each state, illustrated in FIGS. 2 as $\alpha 0$ and $\beta 0$, will be equal to one another, i.e. each equal to $T0/2$ where $T0$ is the cycle period at zero magnitude. If the magnitude of the input signal SIN increases the duration of the pulse of one state will increase and the duration of the pulse of the other state will decrease to first order by:

$$\alpha=T0/2\cdot(1-X)\ \beta=T0/2\cdot(1+X)$$

where X is the level of the normalised input signal, i.e.

$$X=SIN/SMAX$$

where SMAX is the maximum magnitude of the input signal defined as (VH−VL)/2. It will be appreciated that an increase in duration of one pulse is not equal to the decrease in duration of the other pulse and so the overall cycle period T will change:

$$T=\alpha+\beta=T0/(1-X2)$$

Thus any increase in the magnitude of the input signal will result in an increase in the cycle period, as illustrated by the durations $\alpha 1$ and $\beta 1$ and duration T1 for a cycle period at a non-zero input signal magnitude. Thus the cycle period T0 (equal to $\alpha 0+\beta 0$) corresponding to an input signal of zero magnitude will be the cycle period of shortest duration. This condition is referred to as the limit cycle and the period T0 is the limit cycle period. This corresponds to the fastest cycle frequency f0=1/T0 which is referred to as the limit cycle frequency.

As noted above the output is a voltage waveform that has a limit cycle period of T0 for a zero-magnitude input signal. For the embodiment illustrated in FIG. 1 the limit cycle period is given by:

$$T0=2\cdot R\cdot C\cdot \ln\{(1+H/(2\cdot SMAX))/(1-H/(2\cdot SMAX))\}$$

where R is the resistance of impedance 108, C is the value of capacitance 101 (and R·C is the time constant of the filter arrangement 106) and H is indicative of the amount of hysteresis applied by the hysteretic comparator 102.

The output PWM signal SPWM thus encodes the level of the input signal SIN as the duty cycle of one of the pulses of output state, i.e. as $\alpha/(\alpha+\beta)$.

Figure 3:
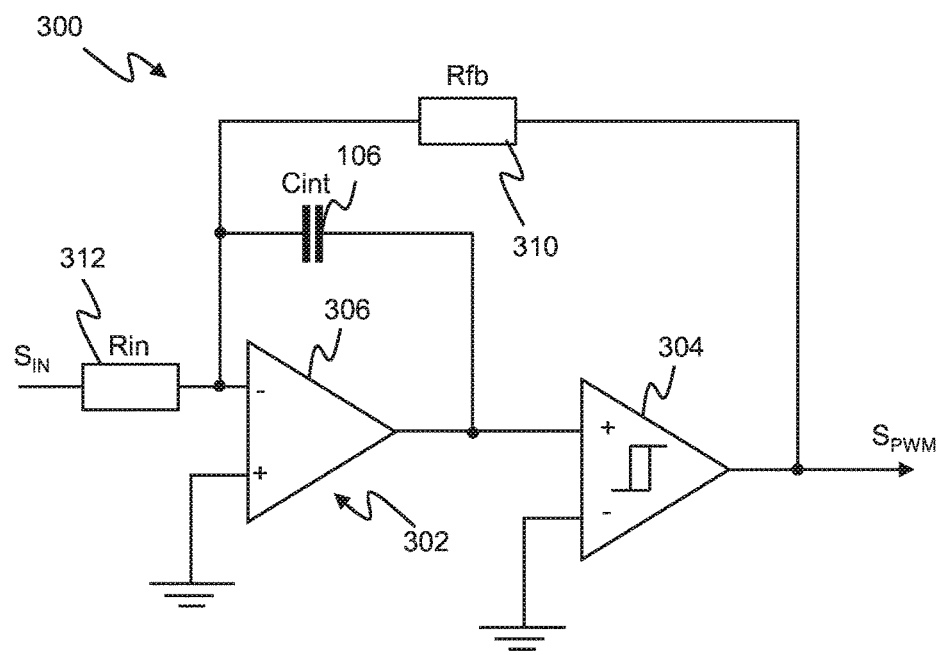
FIG. 3 is a schematic diagram of a TEM.

FIG. 3 is a schematic diagram of another example time encoding modulator (TEM) 300 comprising an asynchronous PWM. The TEM 300 comprises an integrator 302 and a hysteresis comparator 304. The integrator 302 comprises a gain element 306 and a feedback capacitor 308 coupled between an output of the gain element 306 and a first input (in this case an inverting input) of the gain element 306. A second input (in this case the non-inverting input) of the gain element 306 is coupled to a first reference voltage (in this case ground). The output of the integrator 302 is provided to a first (in this case non-inverting input) of the hysteresis comparator 304. A second (in this case inverting) input of the hysteresis comparator 304 is coupled to a second reference voltage (in this case ground). A feedback resistor 310 is provided between the output of the hysteresis comparator 304 and the first (e.g. inverting) input of the gain element 306. An input resistance 312 is provided in series between the first input of the gain element 306 and the input of the TEM 300.

Like the TEM 100 shown in FIG. 1, the TEM 300 receives an analog input signal SIN and generates a pulse width modulated output signal SPWM. The PWM signal SPWM transitions between first and second output states and the signal level of the input signal is encoded by the duty cycle of a first output state, i.e. the proportional of the overall cycle period that corresponds to the first output state, or equivalently the amount of time that the PWM signal SPWM spends in the first output state compared to the second output state.

It will be appreciated that a variety of known time encodings techniques can be used to emulate the principle described above, but in general, any PWM method known in the art can be used.

Embodiments of the present disclosure utilise digital inverters to construct delays for time encoded signals. Using the combination of time encoding modulators and digital inverters for delay, filters can be designed without the need for large capacitors as is conventional in analog circuit design.

Figure 4A:
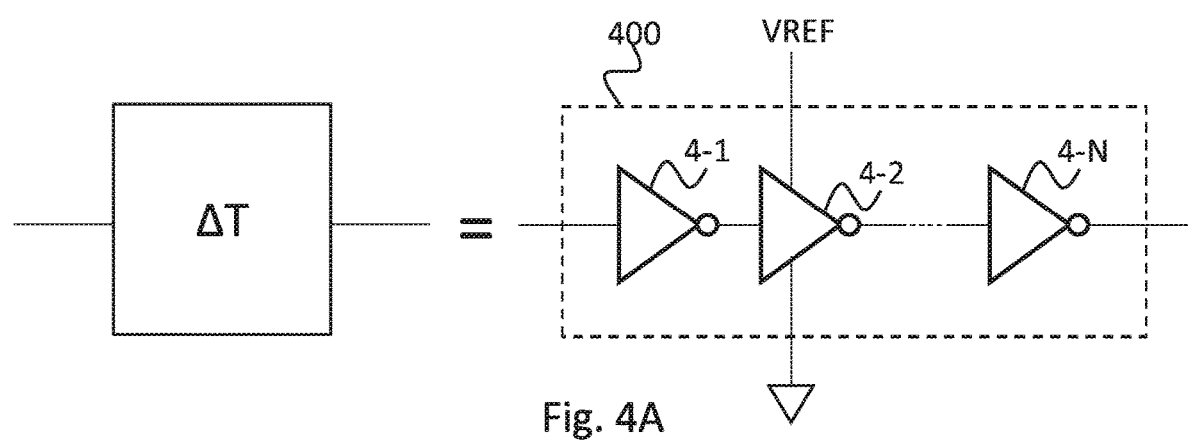
FIGS. 4A and 4B are schematic diagrams of inverter-based delay elements.

FIG. 4A is a schematic diagram of the delay element 400 according to various embodiments of the disclosure. The delay element 400 comprises a plurality (N) inverters 4-1, 4-2, 4-N connected in series, each configured to apply a delay. Preferably, the delay in at least one of the plurality of inverters 4-1:4-N is controlled by varying a supply voltage provided thereto. In the example shown in FIG. 4, a controllable reference voltage VREF is provided as the supply voltage to the second inverter 4-2 of the delay element 400 to control the delay in the delay element 400. In other embodiments the supply voltage of two or more of the N inverters 4-1, 4-2, 4-N may be varied to control the overall delay of the delay element 400.

The delay of the delay element 400 may be made either inverting or non-inverting based on the number N of inverters provided. An even number of inverters will give a non-inverting delay, whereas an odd number of inverters will give an inverting delay.

Figure 4B:
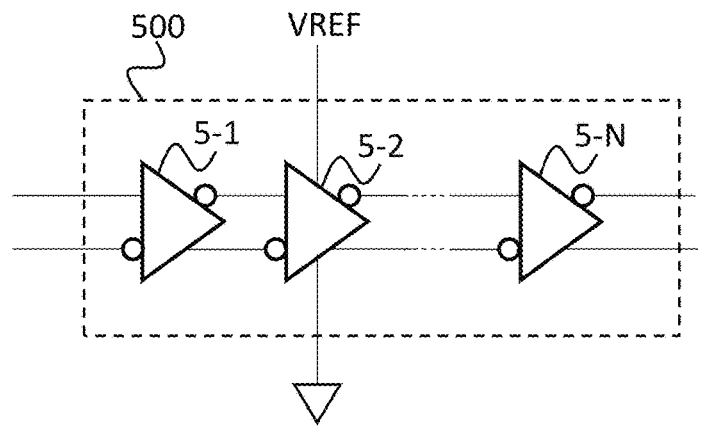

FIG. 4B is a schematic diagram of the delay element 450 according to various embodiments of the disclosure. The delay element 450 comprises a plurality (N) differential inverters 5-1, 5-2, 5-N connected in series, each configured to apply a delay. Like the delay element 400 of FIG. 4A, the delay element can be made inverting or non-inverting depending on the number N of inverters 5-1, 5-2, 5-N provided in the string. It will be appreciated that an advantage of using differential delay is that it provides improved power supply rejection when compared with the non-differential example shown in FIG. 4A. Inverter delays are well known in the art and so will not be described in more detail here.

The delay associated with the delay elements 400, 450 will vary with temperature and supply voltage. To stabilise the delay of the delay elements 400, 450, a delayed lock loop (DLL) may be provided to generate the reference voltage VREF used to control the delay of the delay elements 400, 450.

Figure 5:
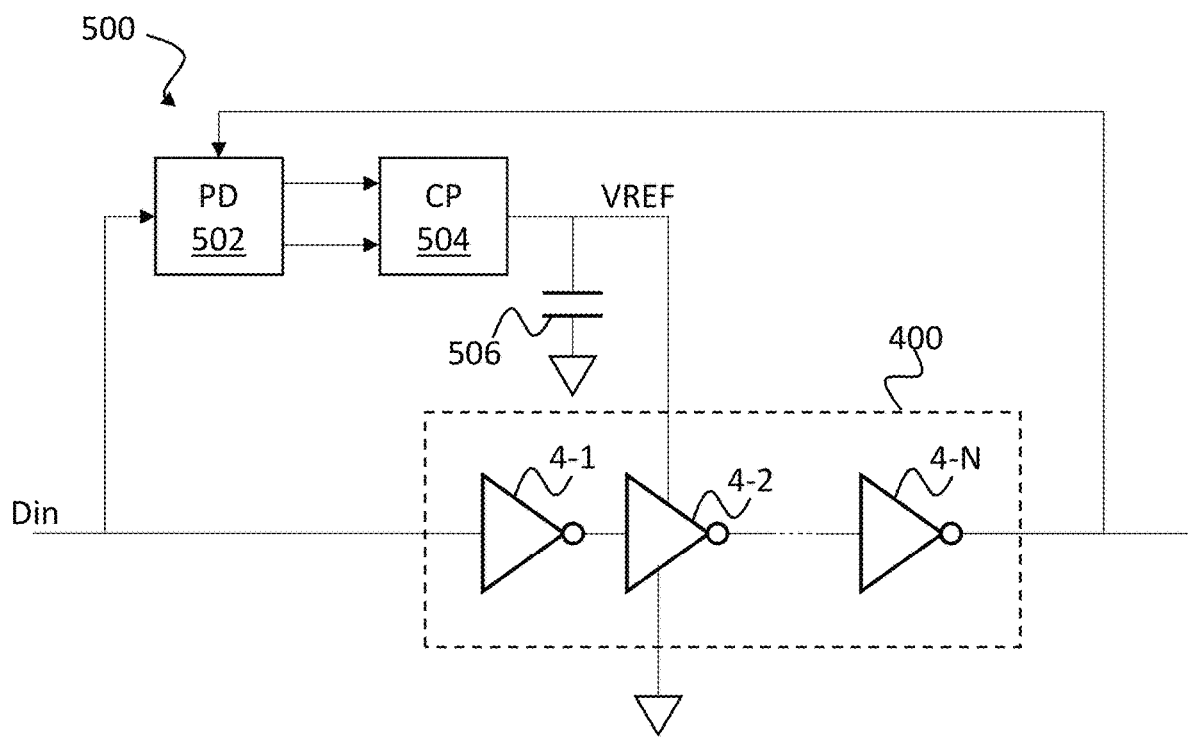
FIG. 5 is a schematic diagram of a delay-locked loop (DLL)

FIG. 5 is a schematic diagram showing an example DLL circuit 500 for controlling the reference voltage VREF supplied to the delay element 400. It will be appreciated that the same DLL circuit 500 could be used to control a supply voltage provided to the delay element 450 shown in FIG. 4B. The DLL circuit comprises a phase detector (PD) 502, a charge pump (CP) 504 and a loop filter 506. The phase detector 502 compares an input signal Din provided to the delay element 504 with the delayed version of that signal output from the delay element 400. The input signal Din is a clock signal of a known frequency. The phase detector 502 controls the charge pump 504 to either increase or decrease the reference voltage VREF until the phase of the input signal Din matches that of the delayed version of the input signal Din. Thus, the DLL circuit 500 is configured to control the reference voltage VREF to maintain a fixed delay ΔT (or "lock" the delay ΔT) despite variations in process, voltage and temperature (PVT variations) which may affect the delay line.

The inventors have determined that many filters can be constructed using the combination of TEMs, such as those described with reference to FIGS. 1 to 4A and 4B, and digital delay elements, such as those described with reference to FIGS. 4A, 4B and 5. An example of such filters will be described in detail with reference to FIGS. 6 to 13. More examples of such filters are provided and described with reference to FIGS. 15 to 22. It will be appreciated that the filters shown are just some examples of many filters and filter arrangements which can be implemented using various combinations of TEMs and delay elements. In all cases, not only can the various TEM based filters be made smaller than their conventional analogue equivalents, but they can also be made more robust against process, voltage and temperature (PVT) variations.

Figure 6:
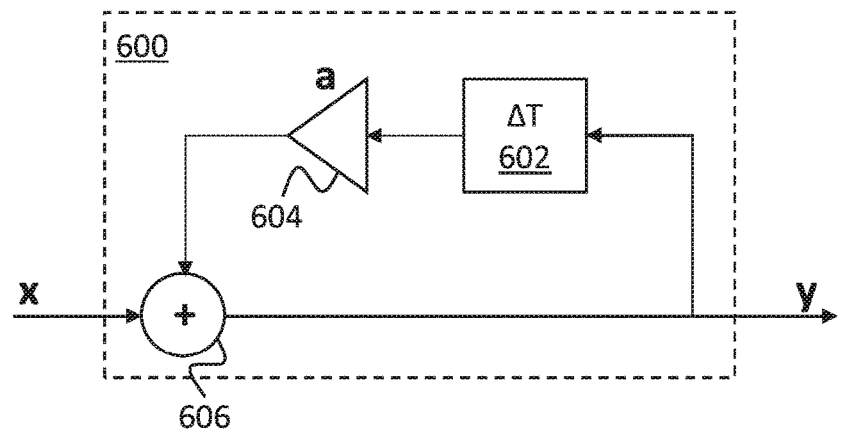
FIG. 6 is a block diagram of a feedback comb filter.

FIG. 6 shows the structure of a feedback comb filter 600 comprising a delay element 602 having a delay ΔT, a gain element 604 with gain a, and an adder 606. As is known in the art, the feedback comb filter 1200 operates by adding a delayed version of the input signal x to itself causing constructive and destructive interference which provide the regularly spaced notches in its frequency response. The transfer function of the feedback comb filter 1200 is given by:

$$\frac{y}{x} = \frac{e^{\Delta T}}{e^{\Delta T} - \alpha}$$

Figure 7:
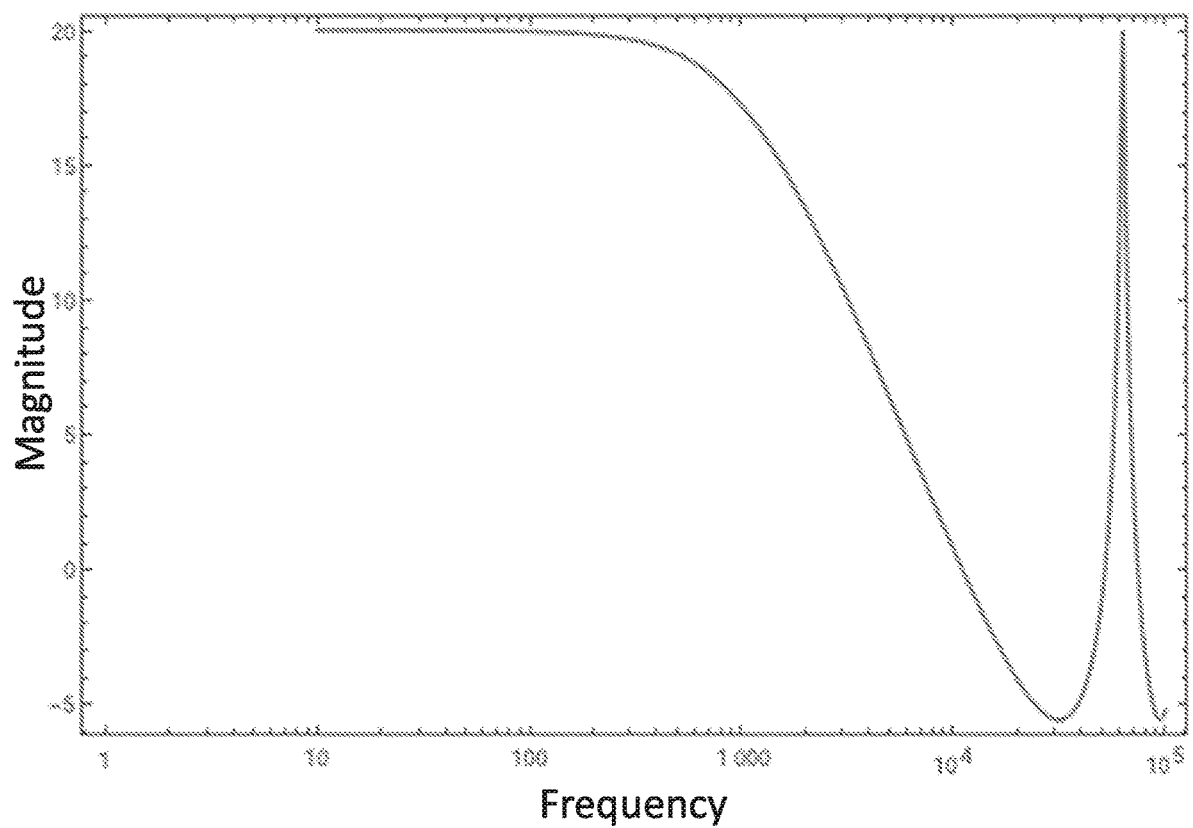
FIG. 7 is a graph showing an example frequency response of the comb filter shown in FIG. 6.

FIG. 7 is a graph of the frequency response of the feedback comb filter 600 shown in FIG. 6 for a gain a of 0.9.

The inventors have realised that a time encoded equivalent of the feedback comb filter 600 can be built using the combination of time encoding modulators and digital delay elements comprising one or more inverters.

Figure 8:
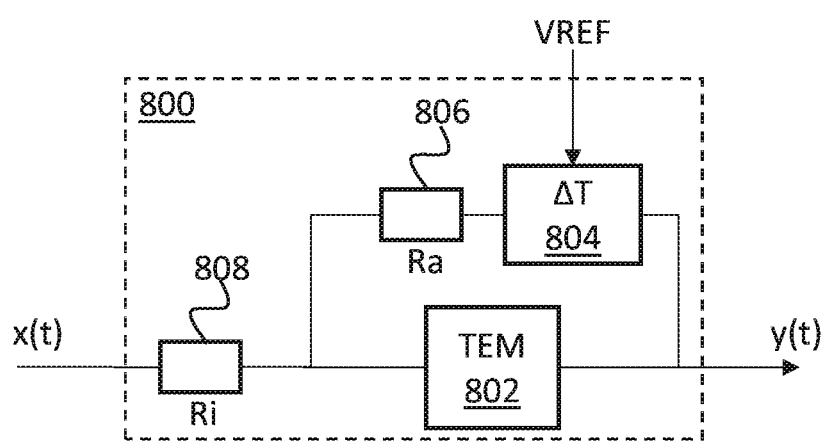
FIG. 8 is a schematic diagram of a feedback comb filter implemented using a TEM and a delay element according to embodiments of the present disclosure.

FIG. 8 is a schematic diagram of a feedback comb filter 800 comprising a TEM 802 and a delay element 804 arranged in a feedback path between an output and an input of the TEM 802. The delay implemented by the delay element 804 is controlled by a supply or reference voltage VREF provided to the delay element 804.

A first resistance 806 is provided in series with the delay element 804 in the feedback path. A second resistance 808 is provided at the input of the TEM 802.

The TEM 802 may be a similar structure to the TEM 100 shown in FIG. 1 or may be implemented using any other PWM topology, such as those described herein. Like the conventional feedback comb filter 800, a delayed time encoded version of the input signal x(t) is added to the input signal x(t) to form the filtered output signal y. Thus, the feedback comb filter 800 operates as an infinite impulse response (IIR) filter.

The first and second resistances 806, 808 are provided to produce a current therethrough. Thus, the resistance values of the first and second resistances 806, 808 control the current flowing through the TEM 802 and the feedback loop respectively. As such, the second resistance 808 is equivalent to the gain element 604 of the conventional feedback comb filter 600 shown in FIG. 6.

A variability of the feedback comb filter 800 is the delay ΔT which in turn is controlled by the reference voltage VREF. It is desirable for the delay ΔT to be controllable and stable. In some embodiments, the delay element 804 is thus implemented using an inverter string, such as that shown in FIG. 4A whose delay ΔT is controlled by a reference voltage VREF. A controllable and stable reference voltage VREF may be provided by a DLL, such as the DLL 500 shown in FIG. 5.

Figure 9:
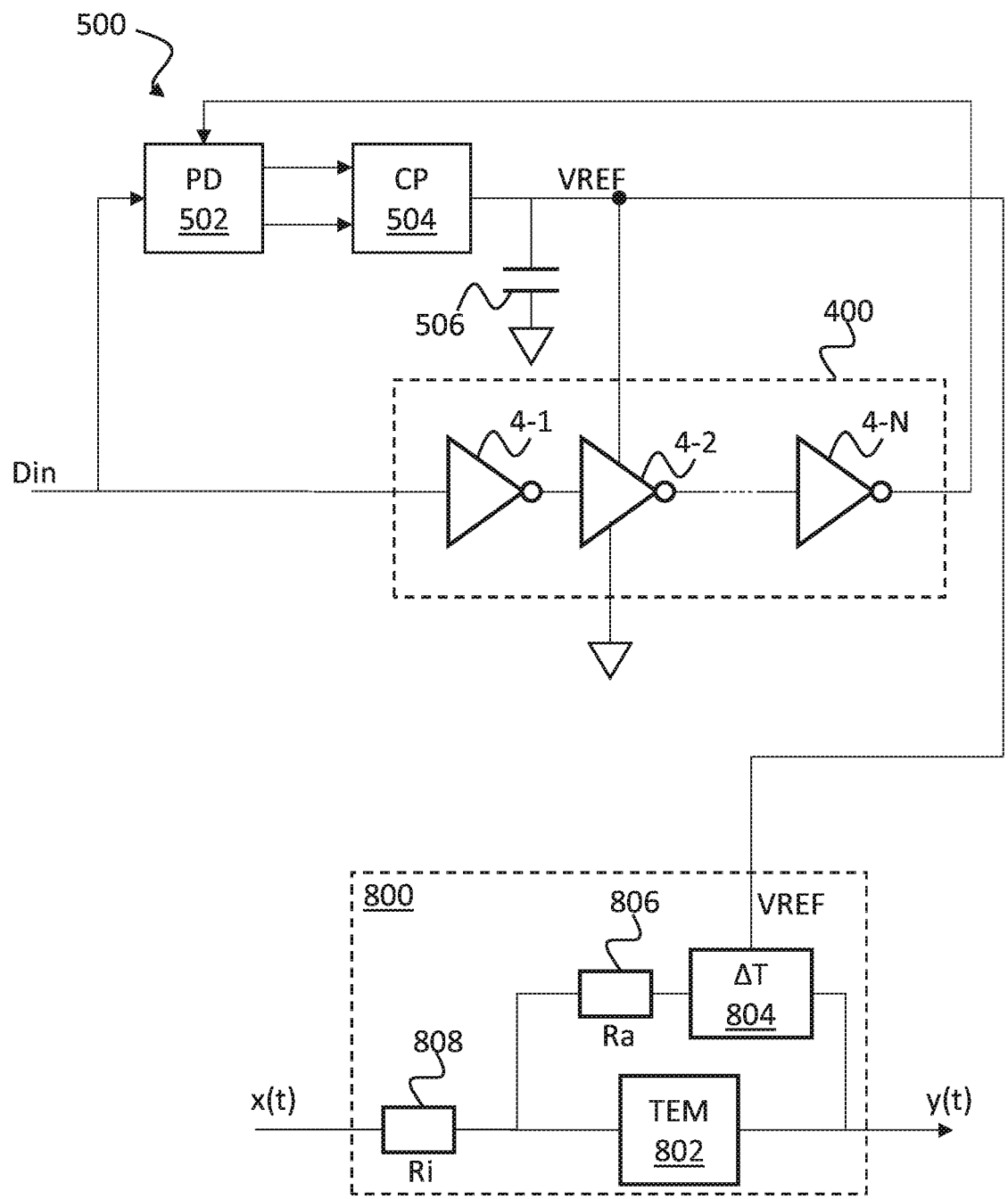
FIG. 9 shows an example arrangement of the feedback comb filter of FIG. 8 in combination with the DLL of FIG. 5.

FIG. 9 shows an example of this in which the DLL 500 shown in FIG. 5 provides the reference voltage VREF to the delay element 804. In this example, in order for the reference voltage VREF to stabilise the delay ΔT of the delay element 804, it is desirable that the delay of the delay line 400 is matched as best as possible to the delay ΔT of the delay element 804.

Figure 10:
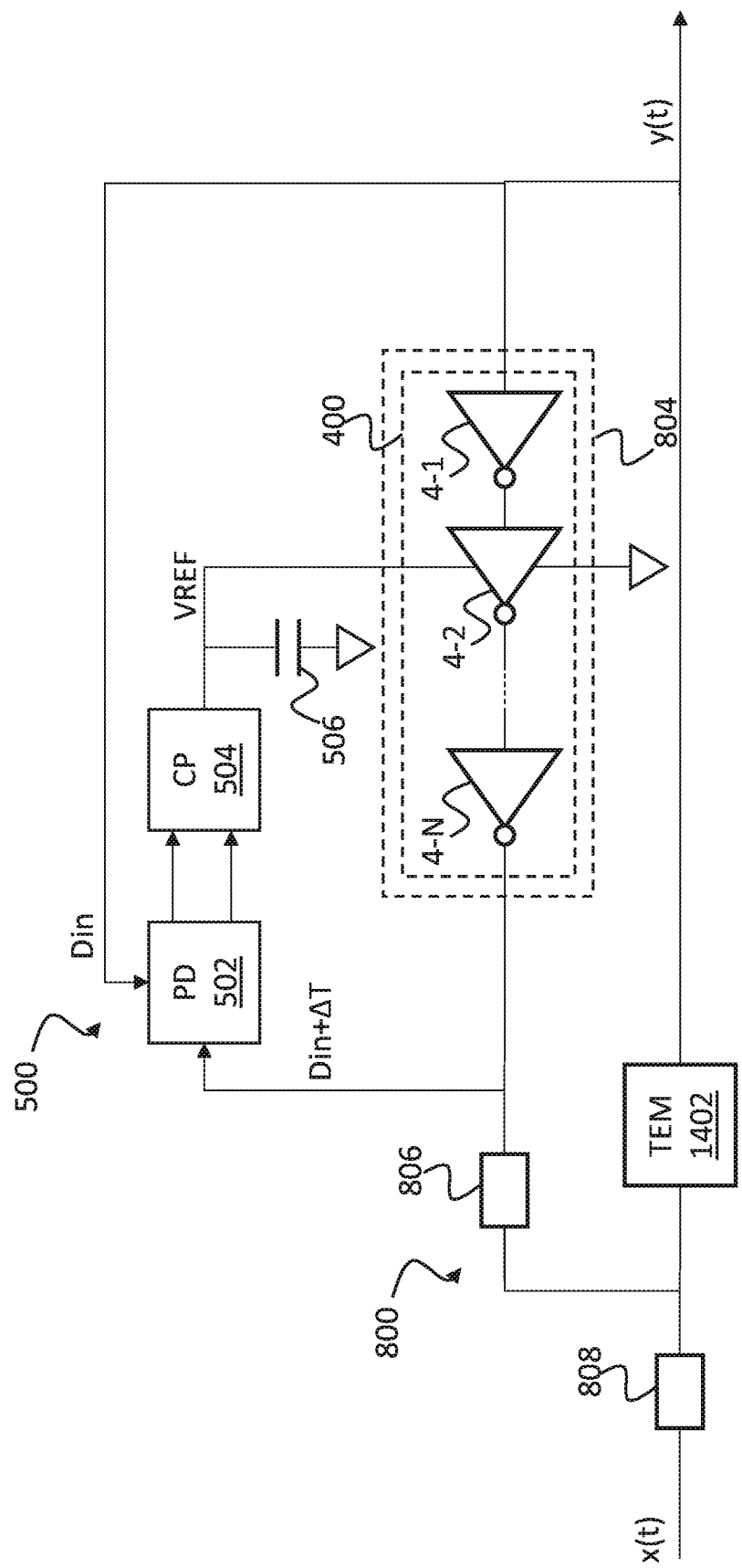
FIG. 10 shows an example arrangement of the feedback comb filter of FIG. 8 in combination with the DLL of FIG. 5.

FIG. 10 shows another example in which the delay element 400 of the DLL 500 is shared both as a delay line in the DLL 500 and as a delay line in the delay element 804 of the comb filter 800. As mentioned above, referring to FIG. 5, the DLL 500 is configured to maintain the delay ΔT of the delay element 400 so that the phase of the delayed version of the input signal Din+ ΔT matches that of the input signal Din. In the embodiment shown in FIG. 10, the DLL 500 is configured to lock to the feedback signal in the feedback loop.

To implement the circuit shown in FIG. 10, the loop bandwidth of the comb filter 800 may need to be reduced when compared to the embodiment shown in FIG. 9, in order to increase the likelihood of the DLL 500 locking to the feedback signal Din received at the phase detector 502.

In systems comprising multiple filters, one or more DLLs may be shared between two or more of the multiple filters. Doing so may result in reduced power consumption, increased performance, and a reduction in overall circuit area or real estate. For example, a single DLL may provide a reference voltage to two or more filters. In another example, two DLLs may provide a reference voltage to three or more filters, and so on.

It may also be advantageous for filters to be provided with a reference voltage from a DLL in close proximity so as to reduce signal latency. Accordingly, in circuits comprising multiple filters, a plurality of DLLs may be distributed across the area of the circuit such that each filter can be serviced by a proximate DLL.

As mentioned above, any variations (e.g., process, temperature, voltage) between delay lines may cause a mismatch in delay between a DLL and a delay line in a filter implementation (such as those described herein). Accordingly, in some embodiments, it may be advantageous to rotate connections of multiple delay lines between one or more filters and one or more DLLs. It may also be advantageous to rotate connection of multiple reference voltages (generated by multiple DLLs) between one or more filters.

In some embodiments, where multiple DLLs are provided, the reference voltage generated by respective DLLs may be rotatably switched between different filters. In doing so, any variation in reference voltage of the respective DLLs may be averaged across all filters. In an example, where three DLLs generate three reference voltage, control circuitry may be configured to switch each of rotate connection of the three reference voltages to one or more delay elements of filters in a circuit.

Additionally or alternatively, the delay elements used to implement delay in DLLs, filters, or both may be rotated between DLLs and/or filters.

Figure 11:
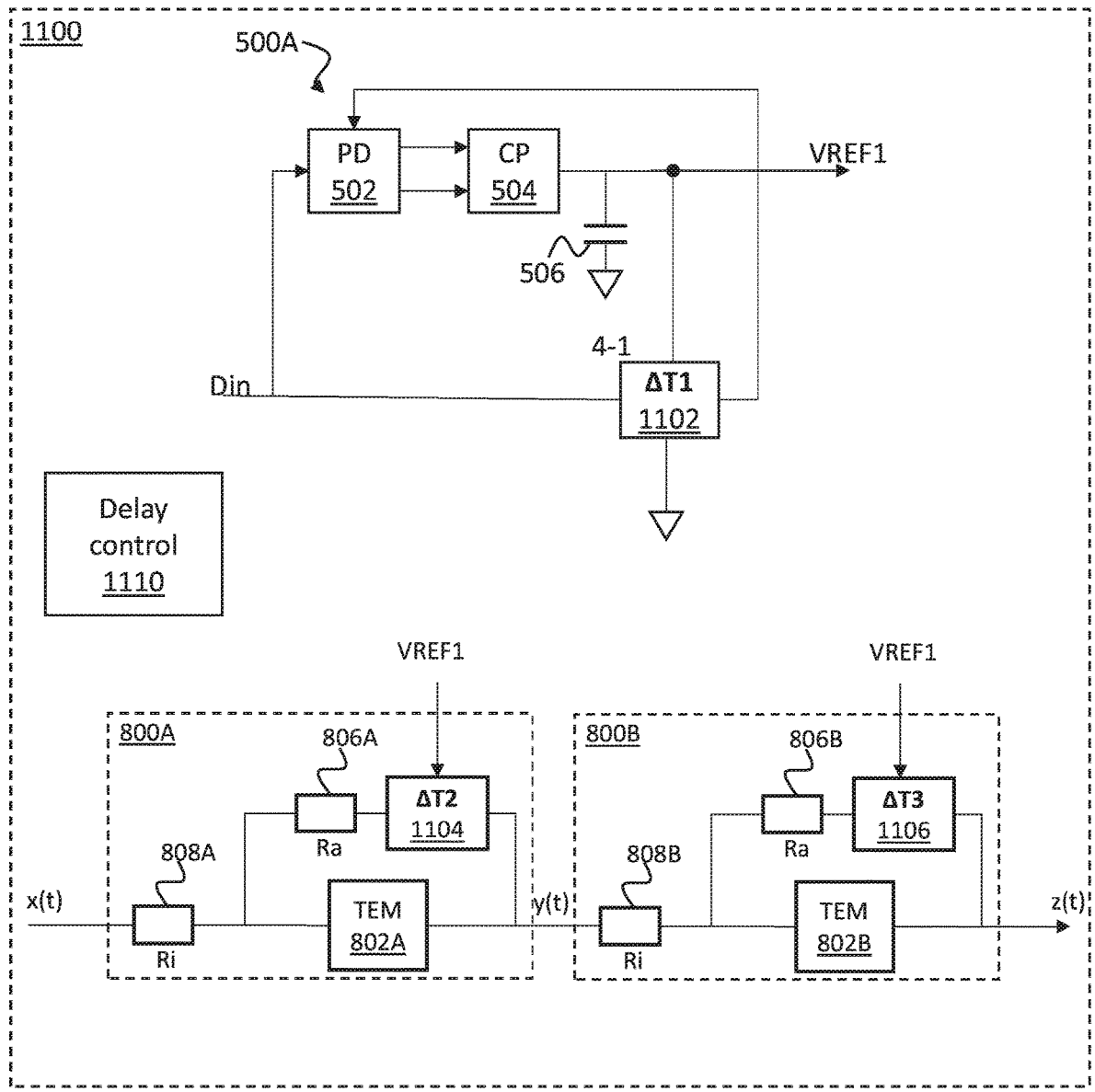
FIGS. 11, 12, and 13 are schematic illustrations of a delay element rotation regime according to embodiments of the present disclosure.
Figure 12:
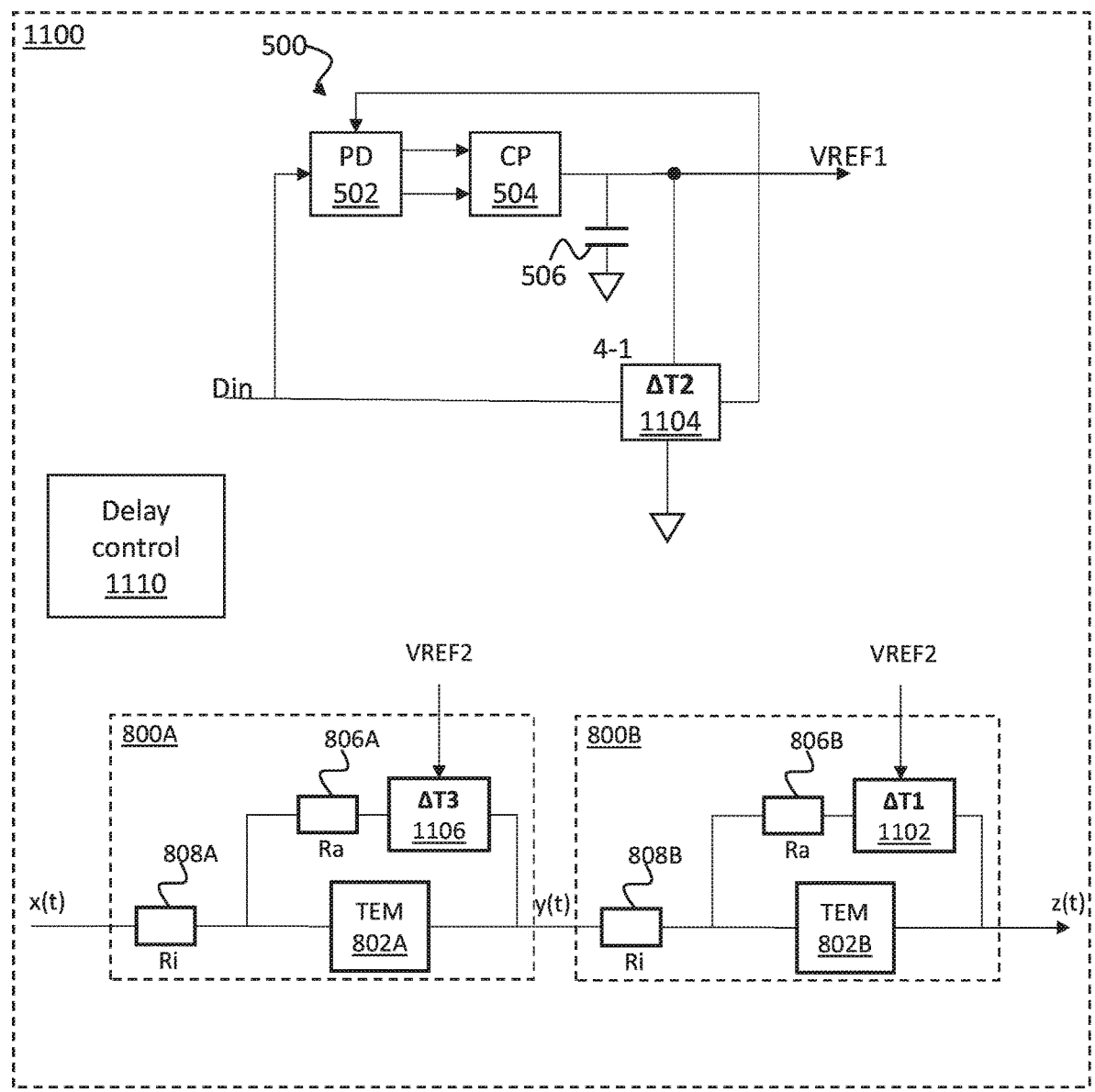
Figure 13:
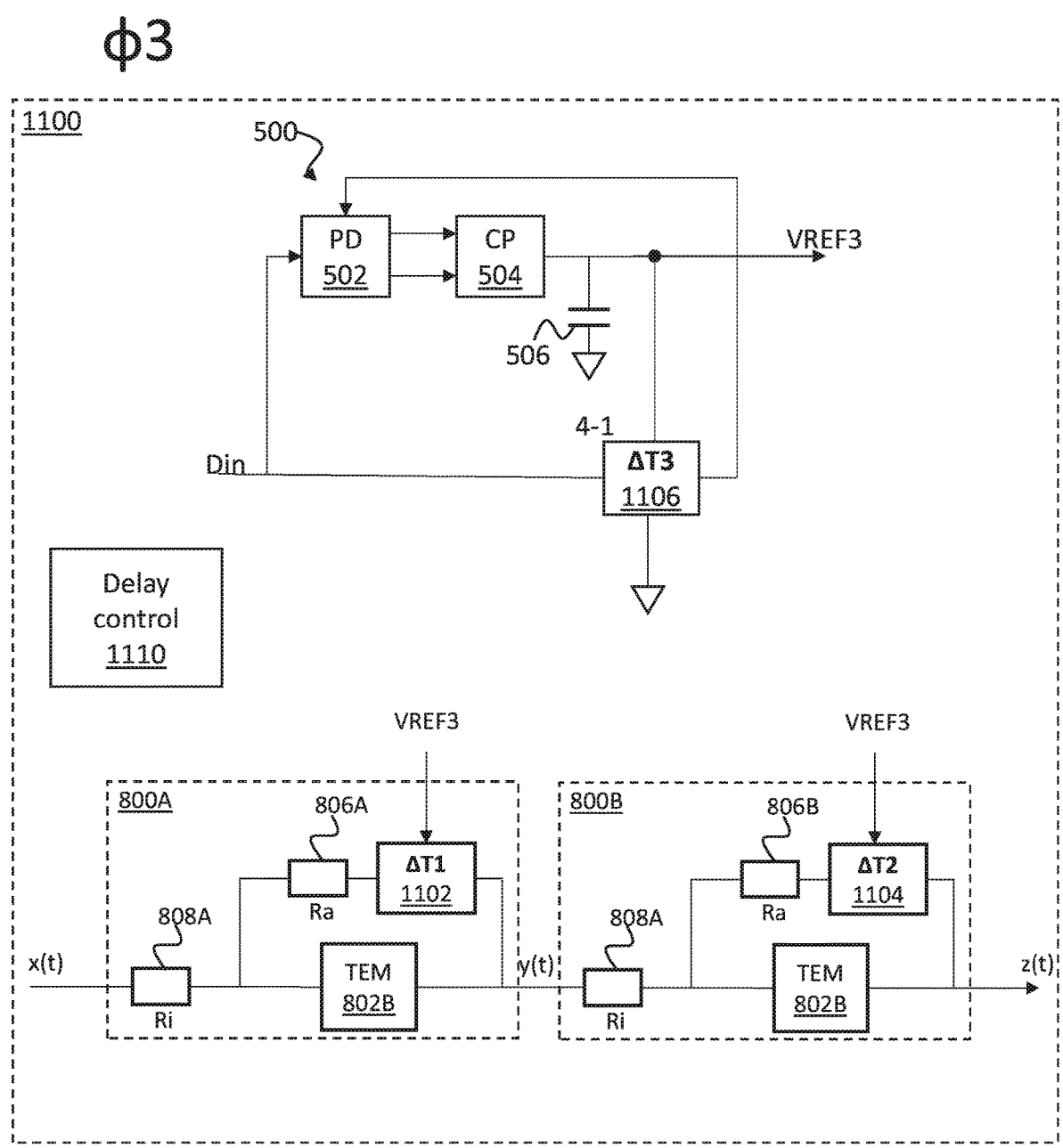

FIGS. 11 to 13 show an example system 1100 comprising a DLL 500A similar to the DLL 500 shown in FIG. 5 and two TEM implemented comb filters 800A, 800B, similar to the comb filter 800 shown in FIG. 8. Like the DLL 500, the DLL 500A comprises the phase detector 502, the charge pump 504 and the capacitor 506. Like the comb filter 800, the comb filters 800A, 800B respectively comprise TEMs 802A, 802B, feedback impedances 806A, 806B and input impedances 808A, 808B.

However, in contrast to the DLL 500 shown in FIG. 5 and the comb filter 800 shown in FIG. 8, the DLL 500A and the comb filters 800A, 800B collectively share three delay elements 1102, 1104, 1106. The delay elements 1102, 1104, 1106 have an associated delay of ΔT1, ΔT2 and ΔT3 respectively. Ideally, the delays ΔT1, ΔT2, ΔT3 of the delay elements 1102, 1104, 1106 would be the same. However, in practice, the delay associated with the delay elements 1102, 1104, 1106 may be different due to process, temperature and voltage (PVT) differences.

To account for such variations, the three delay elements 1102, 1104, 1106 are rotated between the DLL 500A such that each delay element 1102, 1104, 1106 spends an equal amount of time in each of the filters 800A, 800B and the DLL 500A.

In a first phase, φ1, shown in FIG. 11, the first delay element 1102 provides delay ΔT1 in the DLL 500A which generates a first reference voltage VREF1 which is provided to the first and second comb filters 800A, 800B. The second delay element 1104 provides the delay ΔT2 in the first comb filter 800A, and the third delay element 1106 provides the delay ΔT3 in the second comb filter 800B.

In a second phase, φ2, shown in FIG. 12, the second delay element 1104 provides delay ΔT2 in the DLL 500A which generates a second reference voltage VREF2 which is provided to the first and second comb filters 800A, 800B. The third delay element 1106 provides the delay ΔT3 in the first comb filter 800A, and the first delay element 1102 provides the delay ΔT1 in the second comb filter 800B.

In a third phase, φ3, shown in FIG. 13, the third delay element 1106 provides delay ΔT3 in the DLL 500A which generates a third reference voltage VREF3 which is provided to the first and second comb filters 800A, 800B. The first delay element 1102 provides the delay ΔT1 in the first comb filter 800A, and the second delay element 1104 provides the delay ΔT2 in the second comb filter 800B.

In some embodiments, control circuitry 1110 may be configured to switch each of the delay elements 1102, 1104, 1106 between the DLL 500A and the comb filters 800A, 800B. The switching may be controlled such that the first, second and third phases φ1, φ2, φ3 are substantially equal in length. It may be advantageous to time the transition of the delay elements 1102, 1104, 1106 so as to prevent delay mismatch due to the transition. For example, the transition or rotation of the delay elements 1102, 1104, 1106 may be timed so as to take place just after a rising edge of the input signal Din.

By rotating the delay elements 1102, 1104, 1106 between the DLL 500A and the comb filters 800A, 800B the slight difference in delay therebetween will be averaged out since each delay element 1102, 1104, 1106 spends an equal time providing delay to each of the DLL 500A and the comb filters 800A, 800B.

It will be appreciated that the system 1100 shown in FIGS. 11 to 13 provides just one example of delay rotation in accordance with embodiments of the present disclosure. The concept may be applied to any combination of DLL(s), filter(s), and shared delay elements. As mentioned previously, whilst the embodiments described above are described with respect to comb filters, the present disclosure is not limited to such filter and the inventive concepts described may be applied to any type of filter implemented using one or more TEMs and one or more delay elements.

Some non-limiting examples of such filters are described later in the present application.

The delay elements described above, such as the delay element 400 shown in FIG. 4A are analogue implementations in which a reference or bias voltage VREF is modulated to modulate the delay associated with each inverter in the delay line. Embodiments of the present disclosure are not, however, limited to analogue delay implementations. In any of the embodiments described, the analogue delay may be replaced with a digital version.

Figure 14:
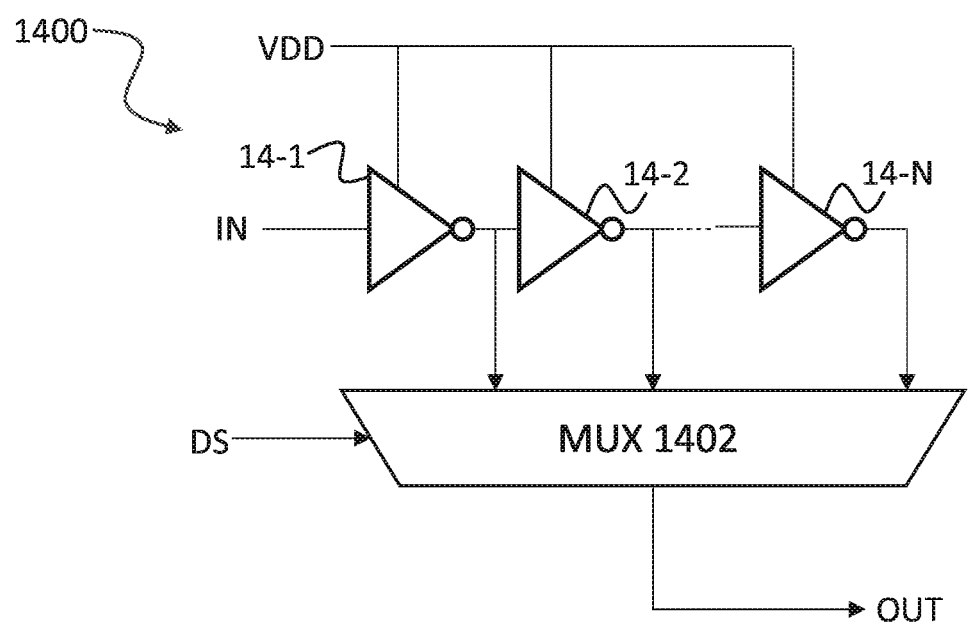
FIG. 14 is a schematic diagram of a digital inverter-based delay element.

FIG. 14 shows an example digital delay element 1400 comprising a string of N inverters 14-1:14-N coupled in series. The inverters are supplied with a fixed supply voltage VDD. The first inverter 14-1 receives an input signal IN to be delayed. An output of each of the inverters 14-1:14-N is provided to a multiplexer 1402 (or other selector). Based on a delay select signal DS the multiplexer 1402 is configured to select one of the outputs from the inverters 14-1:14-N as an output signal OUT. As such, the delay of the delay element 1400 is varied by selecting how many of the N inverters 14-1:14-N are used to delay the input signal IN.

As mentioned previously, the present disclosure is not limited to comb filters and the inventive concepts described may be applied to any type of filter implemented using one or more TEMs and one or more delay elements. Some non-limiting examples of such filters will now be described with reference to FIGS. 15 to 18.

Figure 15:
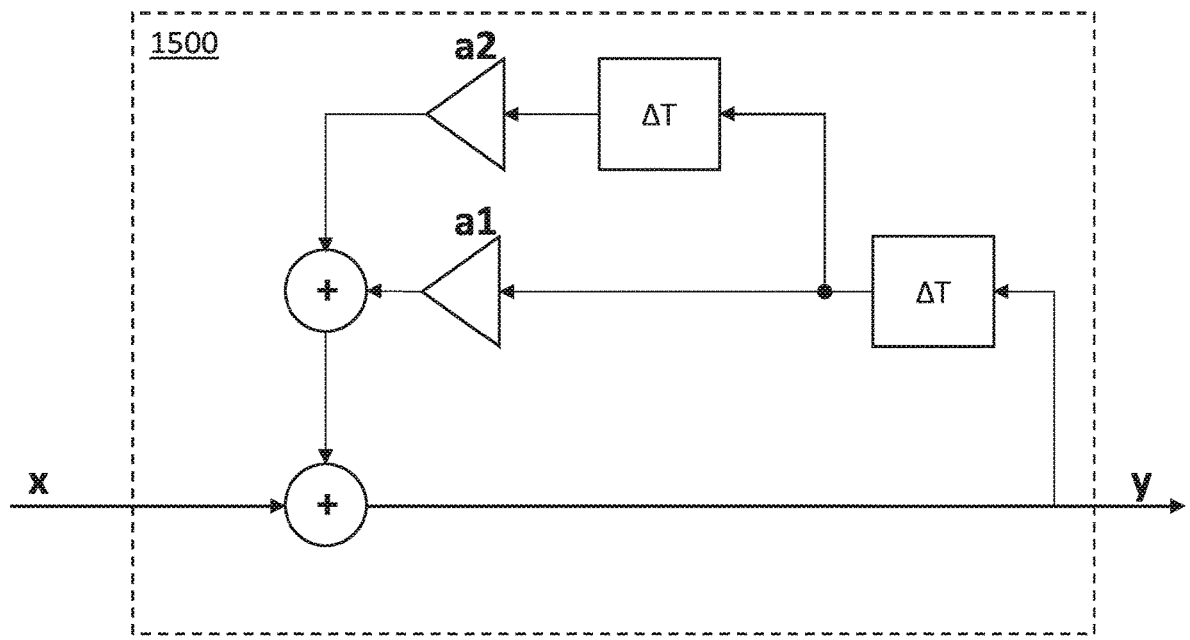
FIG. 15 is a block diagram of a second order feedback filter.
Figure 16:
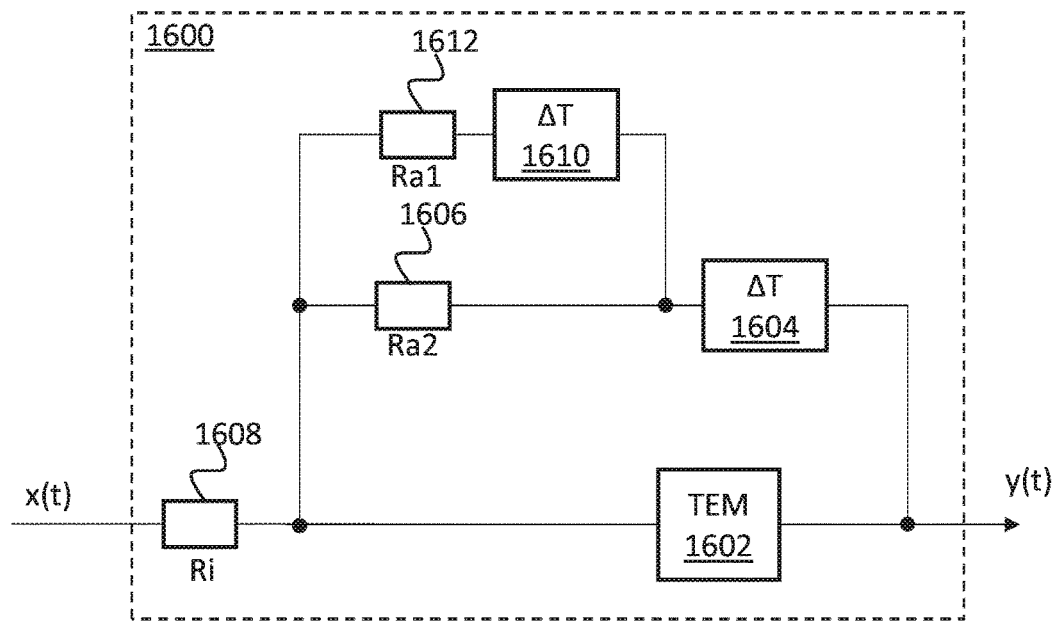
FIG. 16 is a schematic diagram of a TEM implementation of the second order feedback filter of FIG. 15.

FIGS. 15 and 16 respectively illustrate a second order feedback IIR filter 1500 and an equivalent TEM implementation 1600 of the second order feedback IIR filter 1500. The second order feedback IIR filter 1500 is known in the art and provided for context, so will not be described in detail here.

The TEM second order feedback filter 1600 comprises a TEM 1602, a first delay element 1604 arranged in a first feedback path between an input and an output of the TEM 1602. A first resistance 1606 is provided in series with the first delay element 1604 in the feedback path. A second resistance 1608 is provided at the input of the TEM 802. A second delay element 1610 is provided in a second feedback path between the output of the first delay element 1604 and the input of the TEM 1602. A third resistance 1612 is provided in series with the second delay element 1610 in the second feedback path.

Figure 17:
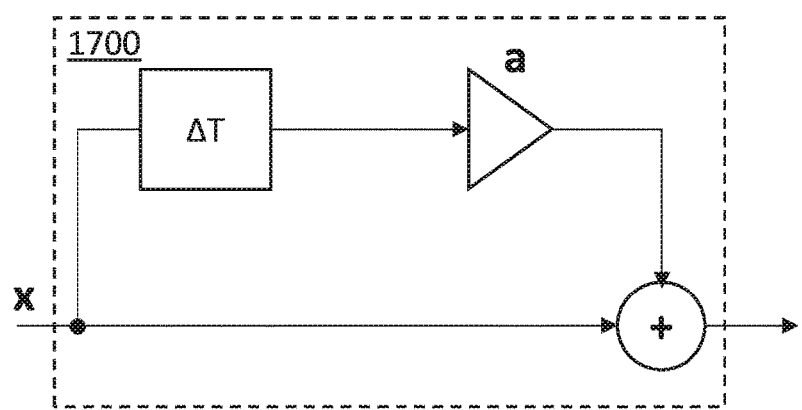
FIG. 17 is a block diagram of a feedforward filter.
Figure 18:
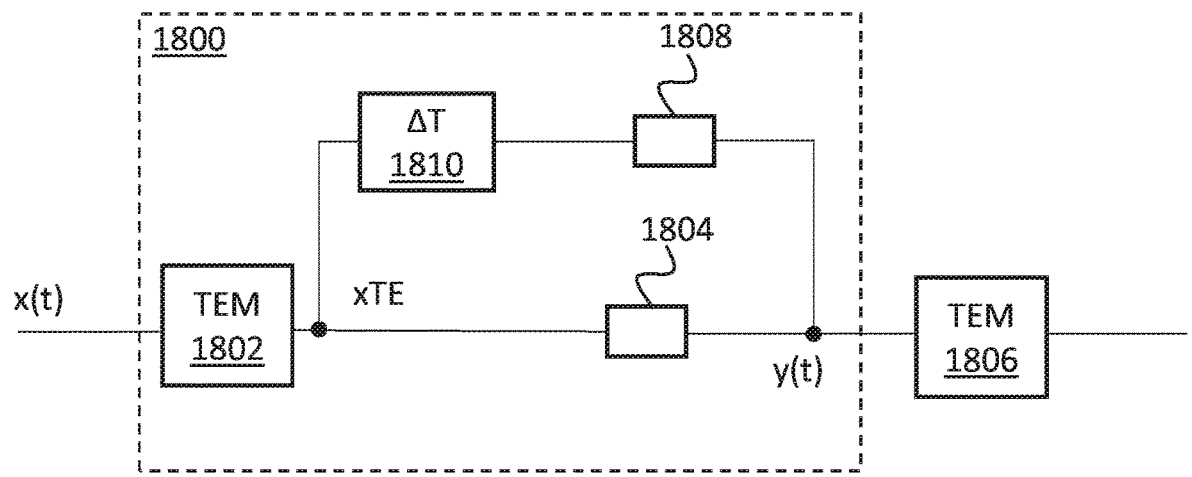
FIG. 18 is a schematic diagram of a TEM implementation of the feedforward filter of FIG. 17.

FIGS. 17 and 18 respectively illustrate a feedforward FIR filter 1700 and a TEM feedforward FIR filter 1800 which is the TEM equivalent to the feed feedforward FIR filter 1700 of FIG. 17. The feedforward FIR filter 1700 is known in the art and provided for context, so will not be described in detail here. As is known in the art, a delayed version of the input signal x is added to the input signal to produce the output of the filter 1700.

The TEM feedforward FIR filter 1800 comprises a first TEM 1802 a first resistance 1804, a second resistance 1808 and a delay element 1810. An input signal is provided to the first TEM 1802 which outputs a time encoded input signal xTE via the first resistance 1804 to the output of the filter 1800. A feedforward path is provided between the output of the first TEM 1802 and the output of the filter 1800 and comprises the delay element 1810 followed by the second resistance 1808. As such, a delayed version of the time encoded input signal xTE is added to the time encoded input signal XTE to produce the output to the filter 1800, which may then be time encoded by a second TEM 1806.

Figure 19:
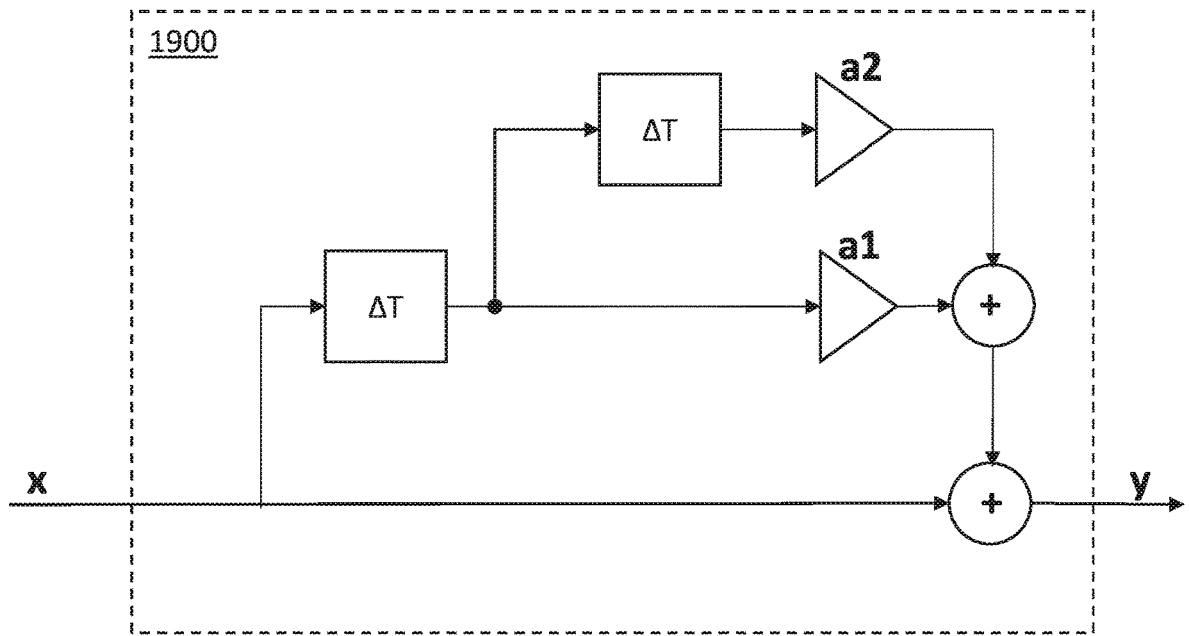
FIG. 19 is a block diagram of a second order feedforward filter.
Figure 20:
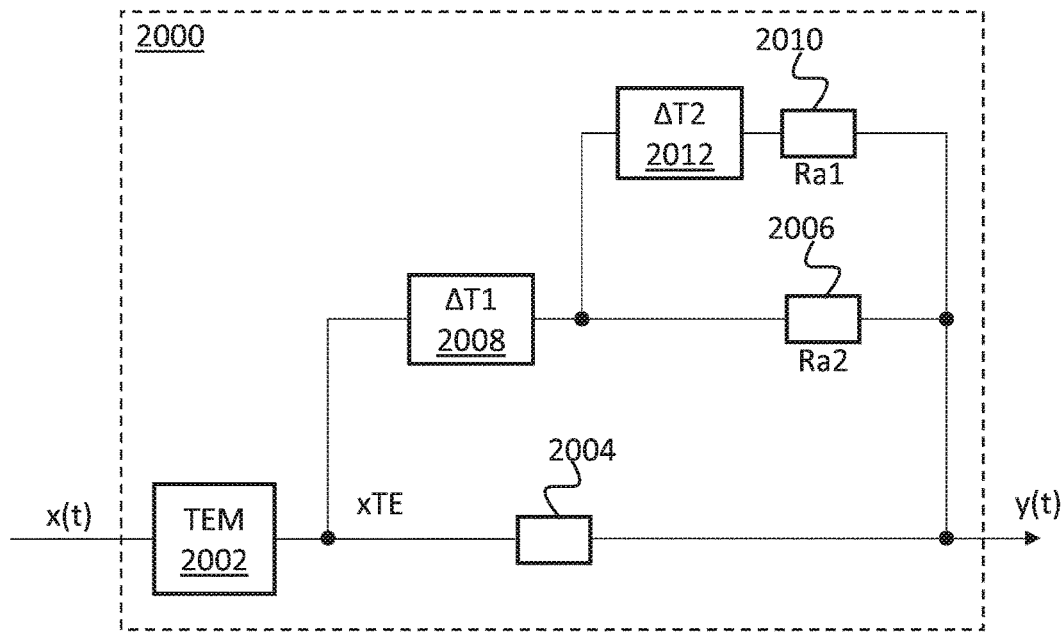
FIG. 20 is a schematic diagram of a TEM implementation of the second order feedforward filter of FIG. 19.

FIGS. 19 and 20 respectively illustrate a second order feedforward FIR filter 1900 and a TEM second order feedforward FIR filter 2000 which is the TEM equivalent to the feed feedforward FIR filter 1900 of FIG. 19. The second order feedforward FIR filter 1900 is known in the art and provided for context, so will not be described in detail here.

The TEM feedforward FIR filter 1800 comprises a first TEM 2002 a first resistance 2004, a second resistance 2006 and a first delay element 2008, a third resistance 2010 and a second delay element 2012. An input signal is provided to the first TEM 2002 which outputs a time encoded input signal xTE via the first resistance 2004 to the output of the filter 2000. A first feedforward path is provided between the output of the first TEM 2002 and the output of the filter 2000 and comprises the first delay element 2008 followed by the second resistance 2008. As such, a delayed version of the time encoded input signal xTE is added to the time encoded input signal xTE. A second feedforward path is provided between the output of the first delay element 2008 and the output of the filter 2000 and comprises the second delay element 2012 and the third resistance 2010. The first and second order delays $\Delta T1$, $\Delta T2$ are applied to the time encoded input signal xTE which are then combined with the input signal xTE to produce the output y(t) to the filter 1800, which may then be time encoded by a further TEM (not shown).

Figure 21:
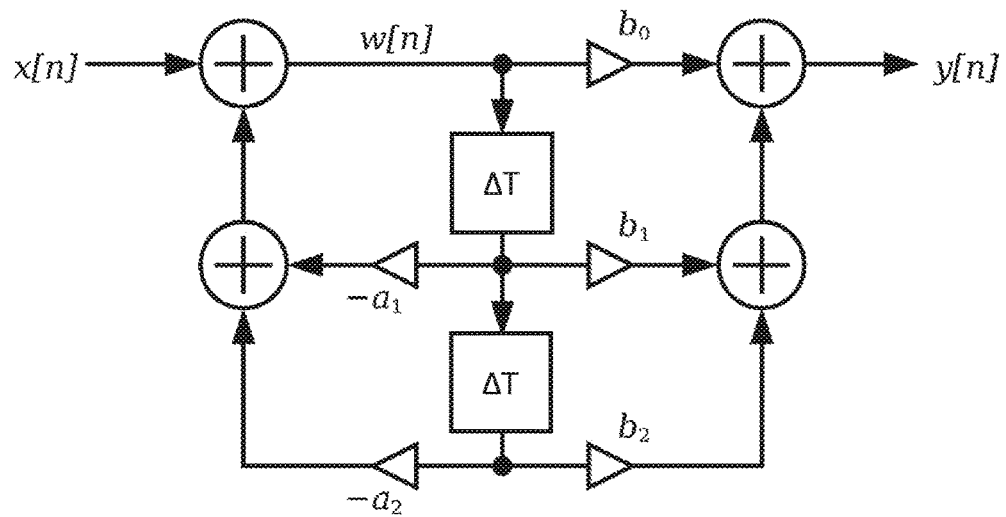
FIG. 21 is a block diagram of a biquadratic filter.
Figure 22:
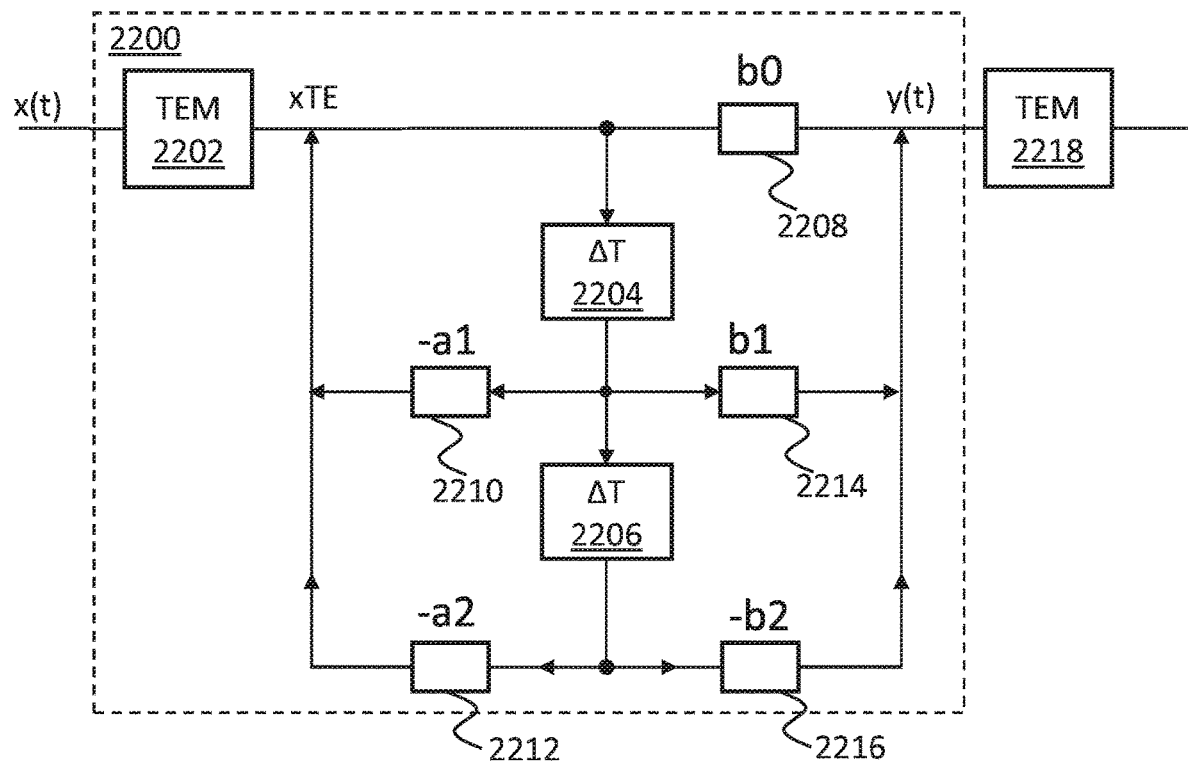
FIG. 22 is a schematic diagram of a TEM implementation of the biquadratic filter of FIG. 21.

FIGS. 21 and 22 respectively illustrate a biquadratic filter 2100 and a TEM biquad filter 2200 which is the TEM equivalent to the biquadratic filter 2100 of FIG. 21. The biquad filter 2100 is a second order recursive linear filter whose transfer function is the ratio of two quadratic functions. The implementation shown in FIG. 21 is known in the art as the direct form 2. However, it will be appreciated that other forms of the biquad filter (such as direct form 1) could equally be implemented using TEMs and delay elements. The function of the biquadratic filter 2100 is known in the art, so will not be described in detail here.

The TEM biquad filter 2200 comprises a first TEM 2202, a first delay element 2204, a second delay element 2206, a first resistance 2208, a second resistance 2210, a third resistance 2212, a fourth resistance 2214 and a fifth resistance 2216. An input signal x(t) is provided to the first TEM 2202 which outputs a time encoded input signal xTE. The output of the first TEM 2202 is provided to the first resistance 2208 which is coupled to the output of the filter 2200. A first order feedback path comprises the first delay element 2204 and the second resistance 2210 and adds a delayed version of the time encoded input signal xTE to the time encoded signal xTE at the output of the first TEM 2202. A second order feedback path comprises the first delay element 2204, the second delay element 2206 and the third resistance 2212 and adds a second order delay at the output of the first TEM 2202. A first order feedforward path comprising the first delay element 2204 and the fourth resistance 2206 is provided between the input of the first resistance 2208 and the output of the filter 2200. A second order feedforward path comprising the first delay element 2204, the second delay element 2206 and the fifth resistance 2216 is provided between the input of the first resistance 2208 and the output of the filter 2200. The output of the filter may then be time encoded by a further TEM 2218.

Thus, the TEM biquadratic filter 2200 shown in FIG. 22 implements the same normalised transfer function as the filter 2100 shown in FIG. 21.

The skilled person will recognise that some aspects of the above-described apparatus and methods may be embodied as processor control code, for example on a non-volatile carrier medium such as a disk, CD- or DVD-ROM, programmed memory such as read only memory (Firmware), or on a data carrier such as an optical or electrical signal carrier. For many applications embodiments of the invention will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog TM or VHDL (Very high-speed integrated circuit Hardware Description Language). As the skilled person will appreciate, the code may be distributed between a plurality of coupled components in communication with one another. Where appropriate, the embodiments may also be implemented using code running on a field-(re)programmable analog array or similar device in order to configure analog hardware.

Note that as used herein the term module shall be used to refer to a functional unit or block which may be implemented at least partly by dedicated hardware components such as custom defined circuitry and/or at least partly be implemented by one or more software processors or appropriate code running on a suitable general purpose processor or the like. A module may itself comprise other modules or functional units. A module may be provided by multiple components or sub-modules which need not be co-located and could be provided on different integrated circuits and/or running on different processors.

Embodiments may be implemented in a host device, especially a portable and/or battery powered host device such as a mobile computing device for example a laptop or tablet computer, a games console, a remote control device, a home automation controller or a domestic appliance including a domestic temperature or lighting control system, a toy, a machine such as a robot, an audio player, a video player, or a mobile telephone for example a smartphone.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. An analog feedback comb filter, comprising:
   a first time-encoding machine (TEM);
   a first feedback loop; and
   a first delay element provided in the first feedback loop.

2. The analog feedback comb filter of claim 1, wherein the first TEM is configured to receive an input signal and generate a time encoded signal.

3. The analog feedback comb filter of claim 1, wherein the first delay element comprises one or more first inverters connected in series.

4. The analog feedback comb filter of claim 3, wherein the first delay element is configured to receive a supply voltage to control the delay of the one or more first inverters.

5. The analog feedback comb filter of claim 3, further comprising one or more delay-locked loops (DLL) configured to generate a supply voltage for the one or more first inverters of the first delay element.

6. The analog feedback comb filter of claim 5, wherein the one or more DLLs comprise a plurality of DLLs each configured to generate a respective reference voltage, the analog feedback comb filter comprising control circuitry configured to cycle between each of the respective reference voltages to be provided as the supply voltage for the one or more first inverters of the first delay element.

7. The analog feedback comb filter of claim 5, wherein the one or more DLLs each comprise a delay line.

8. The analog feedback comb filter of claim 7, wherein each delay line comprises one or more second inverters connected in series.

9. The analog feedback comb filter of claim 7, wherein the delay line comprises the one or more first inverters of the first delay element.

10. The analog feedback comb filter of claim 7, wherein the delay line is switchable between comprising one or more second inverters connected in series and comprising the one or more first inverters of the first delay element.

11. The analog feedback comb filter of claim 10, further comprising control circuitry configured to periodically switch the delay line between comprising the one or more second inverters and comprising the one or more first inverters of the first delay element.

12. The analog feedback comb filter of claim 10, wherein the first delay element is switchable between comprising one or more second inverters connected in series and comprising the one or more first inverters of the first delay element.

13. The analog feedback comb filter of claim 10, wherein the delay line is a digital delay line comprising a plurality of second inverters, wherein the DLL comprises:
DLL control circuitry configured to control the number of the second inverters provided in the delay line.

14. The analog feedback comb filter of claim 3, wherein the delay element is a digital delay element.

15. An electronic device comprising the analog feedback comb filter of claim 1.

16. The electronic device of claim 15, wherein the device comprises one of a mobile computing device, a laptop computer, a tablet computer, a games console, a remote-control device, a home automation controller or a domestic appliance, a toy, a robot, an audio player, a video player, or a mobile telephone, and a smartphone.

17. The analog feedback comb filter of claim 1, wherein:
the first feedback loop is configured to feedback from an output of the TEM to an input of the TEM.

18. A biquadratic analog filter, comprising:
a first time-encoding machine (TEM);
a first feedback loop comprising a first delay element;
a second feedback loop comprising the first delay element and a second delay element;
a first feedforward loop comprising the first delay element; and
a second feedforward loop comprising the second delay element and a third delay element.

19. An analog filter, comprising:
a first time-encoding machine (TEM);
a first delay element comprising one or more first inverters connected in series;
a plurality of delay locked loops each configured to generate a respective reference voltage; and
control circuitry configured to cycle between each of the respective reference voltages to be provided as a supply voltage to control a delay of the one or more first inverters of the first delay element.

20. An analog filter, comprising:
a first time-encoding machine (TEM);
a first delay element comprising one or more first inverters connected in series; and
one or more delay locked loops each configured to generate a supply voltage to control a delay of the one or more first inverters, the one or more delay locked loops each comprising a delay line switchable between comprising one or more second inverters connected in series and comprising the one or more first inverters of the first delay element.

21. An analog filter, comprising:
a first time-encoding machine (TEM);
a first delay element comprising one or more first inverters connected in series;
one or more delay locked loops each configured to generate a supply voltage to control a delay of the one or more first inverters, the one or more delay locked loops comprising a digital delay line comprising a plurality of second inverters; and
control circuitry configured to control the number of second inverters provided in the delay line.

22. An analog filter, comprising:
a first time-encoding machine (TEM);
a first feedback loop;
a first delay element provided in the first feedback loop; and
a first resistance provided in the first feedback loop.

* * * * *